(12) United States Patent
Komai et al.

(10) Patent No.: US 6,709,979 B2
(45) Date of Patent: Mar. 23, 2004

(54) METHOD OF MANUFACTURING A SEMICONDUCTOR DEVICE

(75) Inventors: Naoki Komai, Kanagawa (JP); Takeshi Nogami, Kanagawa (JP); Hideyuki Kito, Kanagawa (JP); Mitsuru Taguchi, Tokyo (JP); Katsumi Ando, Tokyo (JP)

(73) Assignee: Sony Corporation, Tokyo (JP)

( * ) Notice: Subject to any disclaimer, the term of this patent is extended or adjusted under 35 U.S.C. 154(b) by 101 days.

(21) Appl. No.: 09/866,940

(22) Filed: May 29, 2001

(65) Prior Publication Data

US 2002/0016064 A1 Feb. 7, 2002

(30) Foreign Application Priority Data

May 29, 2000 (JP) ...................................... P2000-157542

(51) Int. Cl.[7] .............................................. H01L 21/44
(52) U.S. Cl. ...................... 438/678; 438/745; 438/677; 438/687; 438/758
(58) Field of Search ................................ 438/678, 584, 438/692, 697, 758, 618, 745, 622, 677, 687

(56) References Cited

U.S. PATENT DOCUMENTS 6,056,864 A * 5/2000 Cheung ...................... 205/222
6,299,741 B1 * 10/2001 Sun et al. ............... 204/224 M
2001/0036746 A1 * 11/2001 Sato et al. ................... 438/745

* cited by examiner

Primary Examiner—Caridad Everhart
Assistant Examiner—Igwe U. Anya
(74) Attorney, Agent, or Firm—Robert J. Depke; Holland & Knight LLP

(57) ABSTRACT

A method of implementing an electrolytic polishing process against a wiring-material film by way of preventing excessive polishing or incomplete polishing caused by presence of differential steps locally generated in the objective wiring-material film. The inventive method comprises a step of forming a wiring-material film for burying recessed portions formed on an insulating film formed on a substrate via a plating process; a step of reducing a local differential step generated on the surface of the wiring-material film by way of preserving the wiring material film on the insulating film; and a final step of removing the wiring-material film deposited on the insulating film by way of preserving such wiring-material film deposited, solely inside of the recessed portions.

4 Claims, 6 Drawing Sheets

METHOD OF MANUFACTURING A SEMICONDUCTOR DEVICE

RELATED APPLICATION DATA

The present application claims priority to Japanese Application No. P2000-157542 filed May 29, 2000, which application is incorporated herein by reference to the extent permitted by law.

BACKGROUND OF THE INVENTION

1. Field of the Invention

The present invention relates to a method of manufacturing a semiconductor device. More particularly, the present invention relates to a method of manufacturing a semiconductor device by forming a multilayered wiring construction by way of burying wiring material in recessed portions formed on an insulating film by applying a plating process.

2. Description of the Related Art

As a conventional practice, aluminum alloy has widely been used for composing wiring material of large-scale integrated circuits (LSIs). On the other hand, relative to such a growing demand for realizing finer construction and faster operating performance of the LSIs, actually, it has become difficult to secure such performance characteristics quite enough to realize higher reliability and lower resistivity via utilization of such wiring material made of aluminum alloy. To solve this problem, because of higher resistance to electro-migration and lower resistivity than those of aluminum alloy, an art for utilizing copper wiring has drawn attention, and yet, copper wiring has already been introduced to some semiconductor devices.

Generally, copper wiring can not easily be formed via a dry-etching process, and thus an art of forming copper wiring via slits is highly promising. In the art of forming copper wiring via slits, initially, predetermined slits are formed through an insulating film disposed between layers composed of silicon dioxide for example, and then, copper wiring material is buried into slits, and then, excessive copper wiring material is removed by applying a chemical-mechanical polishing process (called CMP process) to complete formation of a copper wiring structure inside of the slits.

Actually, a wide variety of methods have been introduced for burying copper wiring material inside of slits, which, for example, include the following: an electrolytic-plating method, a chemical vapor deposition (CVD) method, a sputtering reflow method, a high pressure-applied reflow method, a non-electrolytic plating method, or the like. Of those methods for burying copper wiring material inside of a slit as viewed from film forming speed, film forming cost, purity and adhesive property of metallic material to be formed, the above cited electrolytic plating method has mainly been utilized for manufacturing semiconductor devices.

An example of such a process for burying copper wiring material inside of slits and holes connecting them by execution of the electrolytic plating method is described below. Initially, tantalum nitride (TaN) is formed into a thin film having 30 nm of thickness for example, via a sputtering process. The TaN film functions itself as a barrier layer for preventing copper elements from being diffused into an inter-layer insulating film composed of silicon dioxide. Next, copper elements are formed into a thin film with 150 nm of thickness via a sputtering process. The formed copper film functions itself as a seed layer when copper elements are deposited thereon via an electrolytic plating process. Next copper elements are buried into slits via deposition by applying an electrolytic plating process.

Next, in order to form a copper wiring structure, excessive copper elements deposited on the inter-layer insulating film are removed. Conventionally, excessive copper deposits are removed via a chemical-mechanical polishing process. In place of the chemical mechanical polishing process, such a method is proposed, which etches back the copper surface by applying an electrolytic polishing process after completing an electrolytic plating process. While executing the electrolytic polishing process, anode of metallic surface is dissolved in specific solution to result in the generation of smooth and lustrous surface. Normally, the electrolytic polishing method has been used for eliminating debris from a surface of aluminum components and stainless steel components as well as for polishing them. In addition, the electrolytic polishing method has also been utilized for pre-treating copper components and copper-alloy components before actually plating them.

Figure 5:
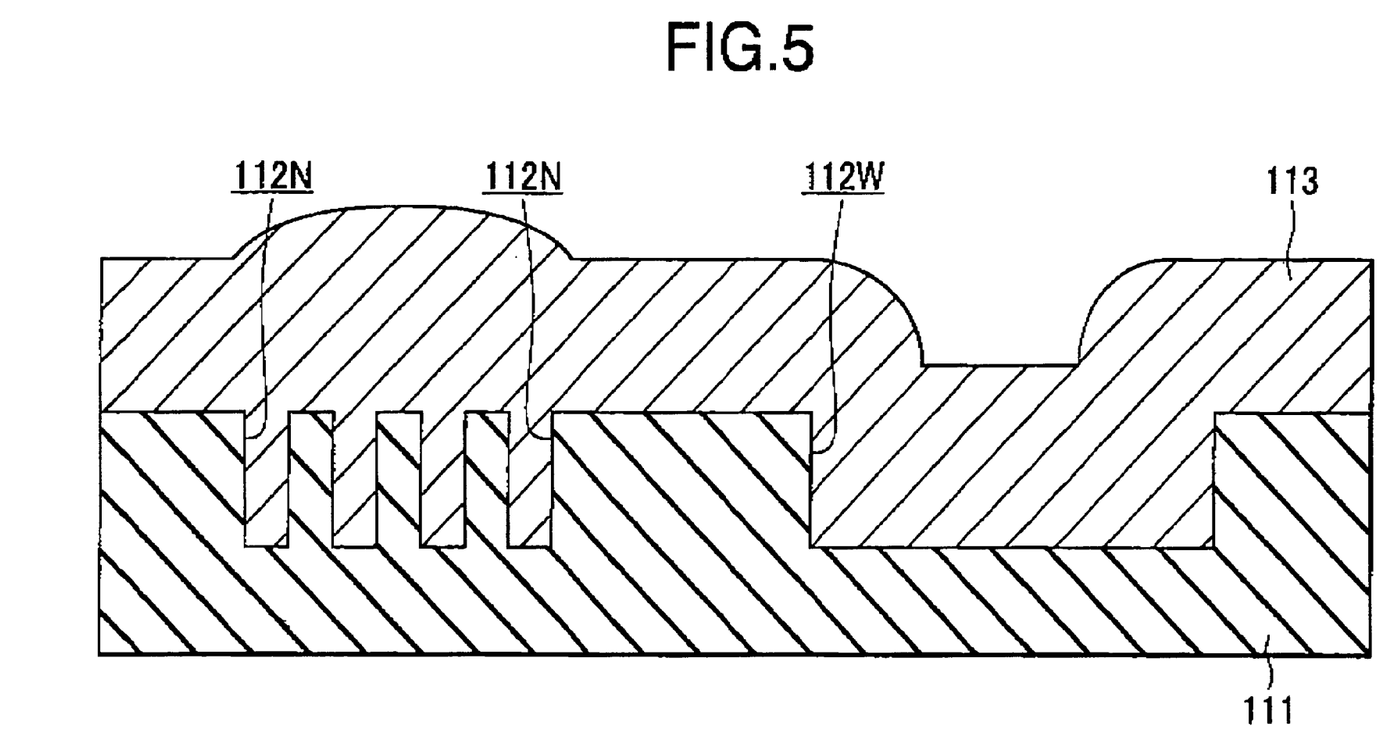
FIG. 5 presents a cross sectional view for describing a problem existing in a conventional method of fabricating a semiconductor device.

Nevertheless, in the case of introducing the above electrolytic polishing method for the process required for manufacturing semiconductor devices, execution of this method relies on such patterns formed on the surface of a substrate whereby causing such a differential step to be generated on the plated film. For example, as shown in FIG. 5, a plated film 113 generates recessed portion corresponding to such a differential step S in broad-width portion above an insulating film 111. On the other hand, the plated film 113 projects itself right above a plurality of slits 112N individually having a narrow width, thus also generating a differential step thereon.

Figure 6:
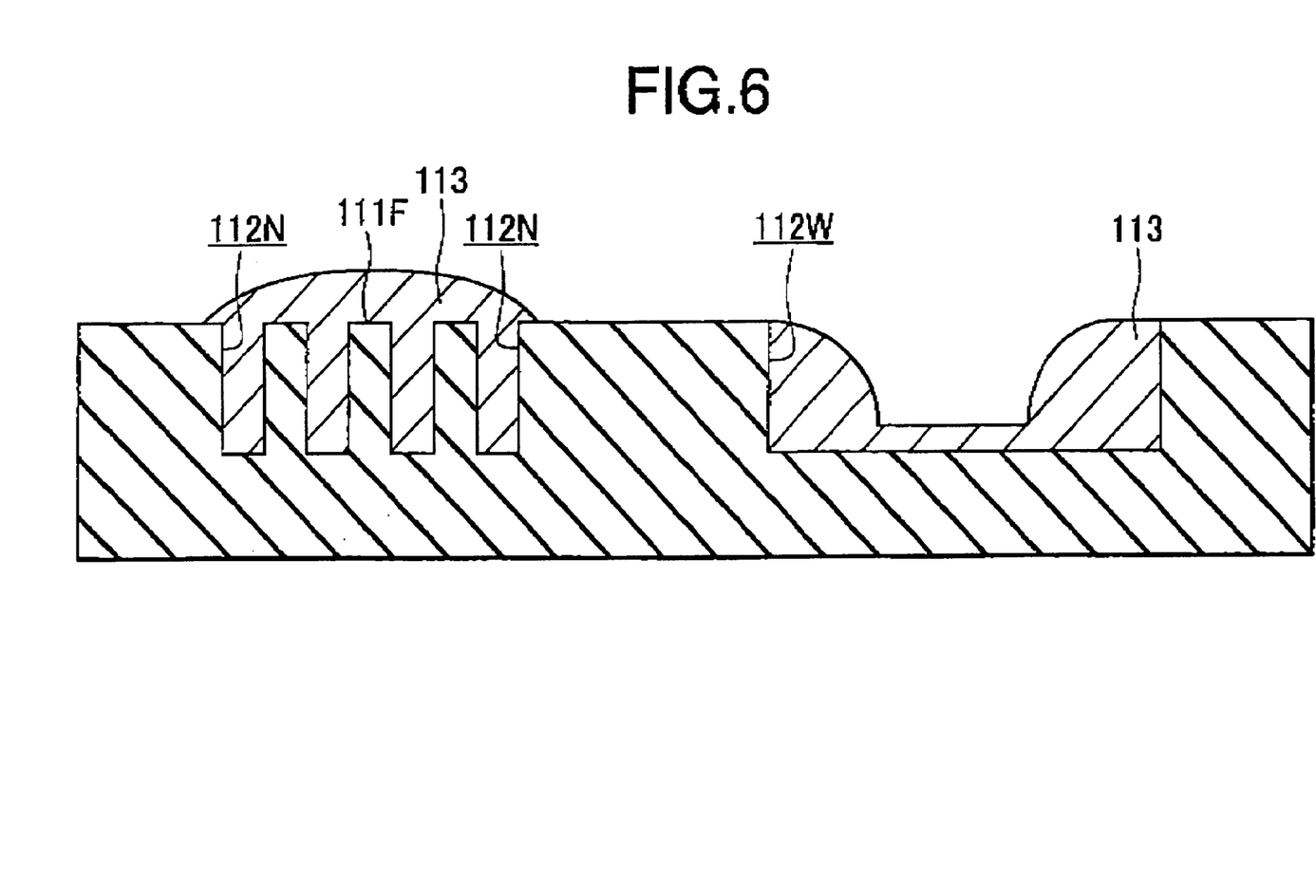
FIG. 6 presents another cross sectional view for explaning a problems existing in the conventional method of fabricating a semiconductor device.

Further, as shown in FIG. 6, because of the above differential steps, there is such a technical problem in which even such a plated film 113 that should have been held as the wiring material inside of a broad-width slit 112W formed in an insulating film 111 has been polished excessively on the way of executing an electrolytic polishing process. Conversely, there is another technical problem in which the plated film 113 still remains on such an area incorporating plural slits 112N each having a narrow width. As mentioned above, once such differential steps have locally been generated on a substrate 111, it will cause focal precision to be degraded in an exposure process while executing a lithographic process, for example, and yet, it will also cause the superimposing precision to be degraded. In addition, due to presence of the remained plated film 113 available for wiring material, short-circuit will be generated between wiring members formed between the narrow-width slits 112N as another problem to be solved.

SUMMARY OF THE INVENTION

In order to fully solve the above mentioned technical problems, the present invention hereby provides a novel method for manufacturing a semiconductor device.

A method for manufacturing a semiconductor device according to a first preferred embodiment of the present invention includes serial steps of an initial step of forming a wiring-material film for burying recessed portions formed in an insulating film formed on a substrate by applying a plating method; a second step of reducing differential steps locally generated on the surface of the above-referred wiring material film by way of preserving such wiring-material film corresponding to slit-formed portions above the insulating film; and a final step of removing the wiring-material film from the surface of the insulating film by applying an electrolytic polishing process while still preserving the buried wiring-material film solely inside of the recessed portions corresponding to the slit-formed portions.

By execution of the first inventive method described above, such differential steps locally generated on the surface of the wiring-material film are canceled while still preserving the required wiring-material film on the insulating film, whereby the surface of the wiring-material film is processed into a substantially flat condition. Next, the wiring-material film on the insulating film is removed by applying an electrolytic polishing process while still preserving the buried wiring material film solely inside of the recessed portions, whereby enabling the recessed portions to be filled with the buried wiring-material film, This in turn makes it possible to solely remove such wiring-material film deposited on unnecessary portions while still preserving such wiring-material film deposited in essential portions, thus enabling to properly form a wiring-structure inside of slits. In addition, since the electrolytic polishing method dispenses with expensive slurry normally used for executing a chemical mechanical polishing process, it is possible to form such a metallic wiring structure at a low running cost. Further, there is also an advantage in that the electrolytic polishing method also avoids generation of erosion normally occurring in the chemical mechanical polishing process.

A second method for manufacturing a semiconductor device according to a second preferred embodiment of the present invention includes the steps of an initial step of forming a wiring-material film via a plating process in order to bury recessed portions formed in an insulating film on a substrate by way of bearing such a thickness more than double the depth of the recessed portions; and a final step of removing the wiring-material film from the surface of the insulating film while still preserving the wiring-material film solely buried inside of the recessed portions.

Since the second preferred embodiment of the present invention described above forms such wiring-material film in order to bury recessed portions formed in the insulating film on the substrate by way of providing such thickness more than double the depth of the recessed portions, thus the surface of the resultant wiring-material film turns into a substantially flat surface. Further, by way of removing the wiring-material film from the surface of the insulating film while still preserving the wiring-material film solely buried inside of the recessed portions, the recessed portions are filled with the buried wiring material film. Accordingly, it is possible to remove such wiring-material film deposited on unnecessary portions while still preserving the wiring-material film deposited on essential portions, thus enabling to properly form such a wiring structure inside of recessed portions.

Further, inasmuch as the electrolytic polishing method dispenses with expensive slurry normally used for executing a chemical mechanical polishing process, it is possible to form a metallic-wiring structure at a low running cost. Further, there is also an advantage in that the electrolytic polishing method does not cause erosion that normally occurs in a chemical-mechanical polishing process.

As described above, according to the method for manufacturing a semiconductor device of the first preferred embodiment of the present invention, while executing an electrolytic polishing process following an electrolytic plating process, it is possible to remove such wiring-material film deposited on unnecessary portions by way of preserving such wiring-material film deposed on required portions, thus making it possible to introduce such an electrolytic polishing process for composing the wiring-material-filled slit structure. Since the electrolytic polishing process dispenses use of an expensive slurry normally used for executing a chemical-mechanical polishing process, it is possible to form a metallic-wiring structure at a low running cost. Further, unlike the chemical-mechanical polishing process, no erosion occurs in the course of executing the electrolytic polishing process.

According to the method for manufacturing a semiconductor device according to the second preferred embodiment of the present invention, since the wring-material film for burying a recessed portion is formed with such a thickness more than double the depth of the recessed portions, it is possible to polish the surface of the wiring-material film into substantially flat condition. Next, the wiring-material film deposited on an insulating film is removed by way of still preserving such wiring-material film deposited solely inside of the recessed portions, thus making it possible to solely remove such wiring-material film deposited on an unnecessary portion while still preserving such wiring-material film deposited on required portions to consequently make it possible to introduce such an electrolytic polishing process for providing a wiring-material-filled slit structure. Further, inasmuch as the electrolytic polishing process dispenses the expensive slurry normally used for executing the chemical-mechanical polishing process, it is possible to form a metallic-wiring structure at a low running cost. Further, there is such an advantage in that, unlike the case of the chemical-mechanical polishing process, the electrolytic polishing process is totally free from generating erosion.

DESCRIPTION OF THE PREFERRED EMBODIMENTS

Referring to FIG. 1 designating cross sectional views, a first form for implementing a method for manufacturing a semiconductor device according to a first preferred embodiment of the present invention is described below.

Figures 1A, 1B:
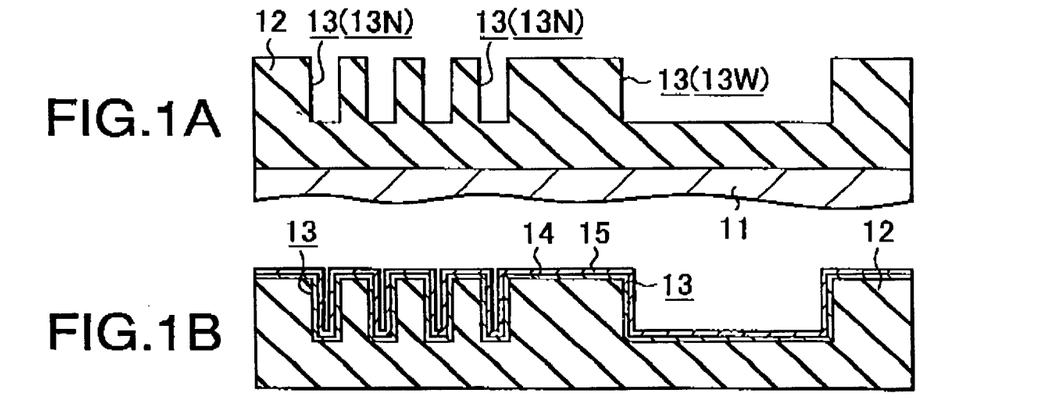
FIG 1 presents a cross sectional view showing a form for implementing the method of manufacturing a semiconductor device according to a preferred embodiment of the present invention.

As shown in FIG. 1A, initially, a predetermined element (not shown in the figures) is formed on a semiconductor substrate 11, for example. Next, an insulating film 12 is formed on the semiconductor substrate 11. Next, a resist pattern is formed via lithographic technique by way of providing pattern's aperture at a predetermined position. Next, using the resist pattern as a masking for an etching process, a plurality of recessed portions 13 individually constituting slits 13 for accommodating wiring material are formed through the insulating film 12 by 0.5 μm of depth, for example. The slit 13 comprises such plural slits 13N respectively formed with a so-called "fine-pattern" and a single broad-width slit 13W comprising 0.5 to 5.0 μm of width for example. Further, such a pad (not shown) comprising 70 to 300 μm of width per side is also formed. In this structure, a plurality of slits 13N each comprising 0.15 to 0.50 μm of narrow width are disposed at intervals of 0.15 to 0.50 μm.

Next, as shown in FIG. 1B, by applying a chemical vapor deposition (CVD) process for example, a barrier layer 14 comprising a tungsten nitride film for example, is formed on the inner surface of the recessed portions 13 as well as on the insulating film 12. As an example of condition for forming the tungsten nitride film, such mixed gas comprising tungsten hexa-fluoride ($WF_6$), nitrogen ($N_2$), and hydrogen ($H_2$) was utilized at a flow rate of 0.25 ml/min. and a film-forming temperature of 300° C. to 400° C.

Next, by applying a physical vapor deposition (PVD) method such as a sputtering process for example, an electrolytic plated seed layer 15 of copper film is formed. As an example of the condition for forming this copper film, the applied condition includes the following: 12KW of DC power for driving the sputtering device; argon (Ar) gas for processing the copper film at a flow rate of 50 $cm^3$/min.; a film-forming atmospheric pressure of 0.2 Pa; and a film forming temperature of 100° C. In addition, illustration for the semiconductor substrate 11 is omitted in FIG. 1A to FIG. 1F.

Figure 1C:
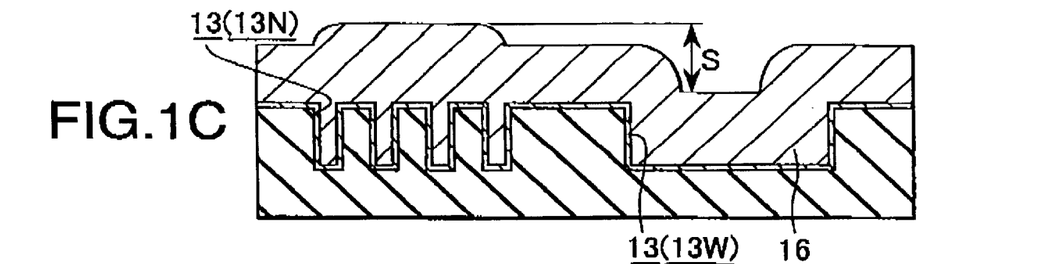

Next, as shown in FIG. 1C, after depositing copper particles of 1.0 μm of thickness by applying an electrolytic plating process, such a wiring-material film 16 is formed to fully bury the slits 13, where the wiring-material film 16 also includes the seed layer shown in FIG. 1B. In this case, it is essential that the wiring-material film 16 shall be formed in the domains of the slits 13 by such a depth deeper than that of the slits 13. Due to differential width at apertures of the slits 13, thickness of the wiring-material film 16 is quite substantial in such domains where the slits 13N are respectively formed by so-called "fine pattern". On the other hand, film thickness of the broad-width slit 13W is thinner than that of the surface of the wiring-material film 16 deposited on the field portion 12F. In this way, such differential steps S are locally generated in the deposited wiring-material film 16.

As an example of the condition for executing the electrolytic plating process cited above, such electrolytic solution comprising copper sulfide was set at a current of 2.83A at a temperature of 18° C. for 4.5 hours, before depositing 1 μm thick copper film.

Figure 1D:
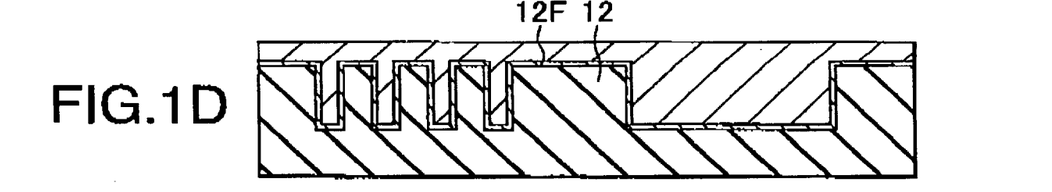

As shown in FIG. 1D, the wiring-material film 16 is then polished by applying a chemical-mechanical polishing process by way of preserving the wiring-material film 16 right above the field portion 12F of the insulating film 12 in order that the differential step S locally generated in the wiring-material film 16 shown in FIG. 1C by effect of the electrolytic plating process can fully be leveled off. This process is executed by applying a chemical-mechanical polishing process, or chemical polishing method, or a mechanical polishing method.

When polishing the wiring-material film 16 by applying the chemical-mechanical polishing method, for example, using such a polishing pad comprising a laminate of a non-woven fabric and an independent foamed substance, the chemical-mechanical polishing process is executed under the condition comprising the following: at a rotation of 30 rpm for a polishing grinder, a rotation of 30 rpm for the polishing head; and then, using alumina slurry added with aqueous solution of hydrogen peroxide for composing a polishing solution, the polishing process executed at a flow rate of 100 cc/min at a temperature of 25° C. to 30° C. for the polishing solution.

Figure 1E:
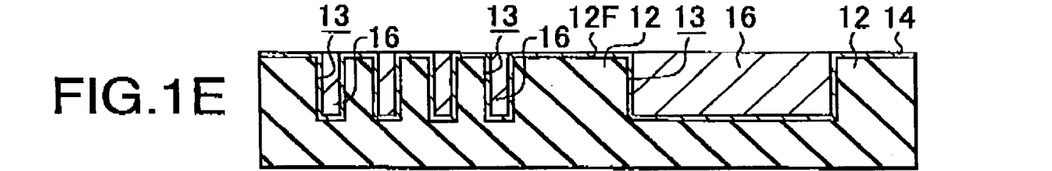

Next, as shown in FIG. 1E, initially, by applying an electrolytic polishing process, the wiring-material film 16 is polished to remove such wiring-material film 16 right above the field portion of the insulating film 12 by solely preserving such wiring-material film 16 deposited inside of the slits 13. While proceeding with the above electrolytic polishing process, simultaneous with the removal of the wiring-material film 16 from the field portion 12F on the insulating film 12, current flows through the barrier layer 14 bearing such electric conductivity lower than that of copper, and thus, in the case in which the wiring-material film 16 still remains on the field portion 12F, electric conductivity of the remaining wiring-material film 16 grows higher than that of peripheral portions to facilitate the electrolytic polishing process. Accordingly, it has become possible to thoroughly and substantially uniformly remove the wiring-material film 17 from the field portion 12F.

As an example of electrolytic polishing process, a polishing solution is formulated by way of the following: phosphoric acid having a specific gravity of 1.6, a current density of $5A/dm^2$ to $20A/dm^2$, and a temperature of 15° C. to 25° C. for sustaining the polishing solution.

While executing the electrolytic polishing process, an electrode (not shown in the figures) is brought into contact with such an object subject to polishing, and thus, the wiring-material film 16 remains in the abutted portion. The remaining wiring-material film 16 is removed via a wet-etching process by utilizing aqueous solution of the mixture of fluoric acid and hydrogen peroxide.

Figure 1F:
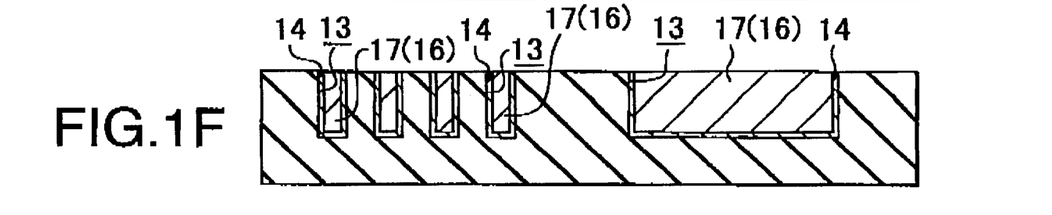

Next, as shown in FIG. 1F, by way of executing a spin-washing process using a solution of hydrogen peroxide, for example, the above-referred barrier layer 14 exposed via the removal of the wiring-material film 16 is then removed. By serially executing thee above processes, a plurality of slit wiring structures 17 comprising plural slits 13 filled with the wiring material 16 buried therein across the barrier layer 14 are formed.

As an example of the process for removing the barrier layer 14 comprising tungsten nitride, it was so arranged to utilize a solution of hydrogen peroxide for rinsing at 15° C. to 40° C. for 1 to 3 minutes of duration.

When forming an upper-layer wiring structure, it is so arranged that, initially, the surface of the substrate 11 treated with those processes described above by referring to FIG. 1 is covered with a silicon nitride film by applying a plasma CVD process, for example, and then, those serial processes identical to those which were previously executed in relation to FIG. 1 are serially executed before forming the upper-layer structure.

Figure 2A:
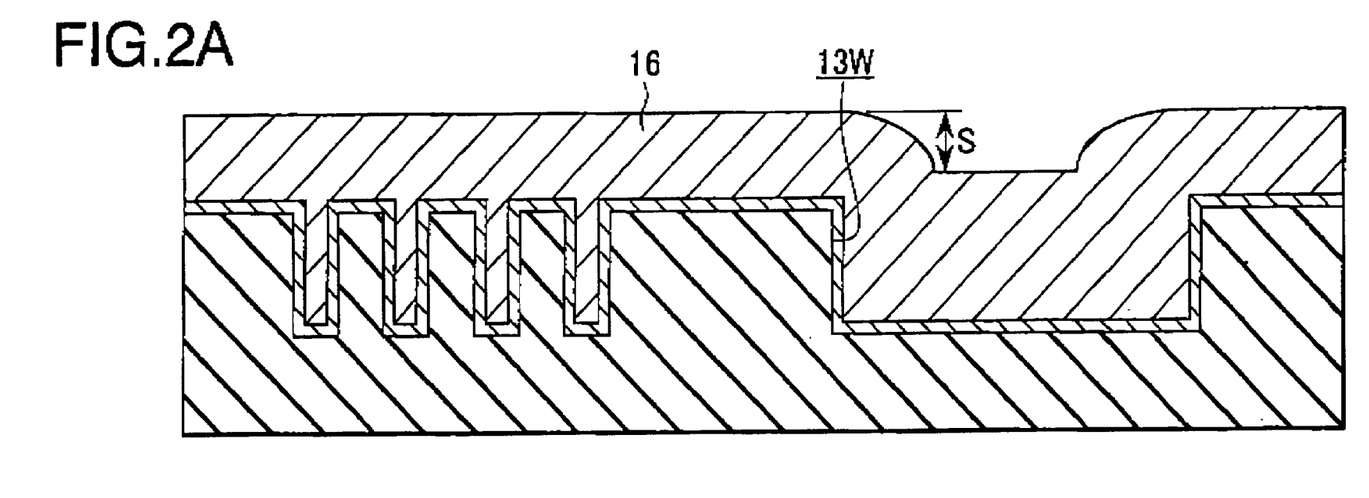
FIG. 2 presents a cross sectional view for describing a method for canceling a locally generated differential step according to a preferred embodiment of the present invention.

After completing the process of polishing the wiring-material film 16 for leveling off the local differential step S described above by referring to FIG. 1D, as shown in FIG. 2A, even when the above differential step S locally generated in the wiring-material film 16 buried inside of the broad-width slit 13W before the polishing process is reduced to 0.5 μm or less, there is no residual wiring-material film 16 in the "fine pattern" area even after executing an ensuing electrolytic polishing process. Further, the wiring material film 16 buried in the broad-width slit 13W is properly polished without generating a recessed portion therein.

Further, after completing the process of polishing the wiring material film 16 for leveling off the locally generated differential step S described above by referring to FIG. 1D, even when such a differential step St comprising the sum of the local differential step S1 formed on the "fine pattern" slit 13N and another differential step S2 formed on the broad-width 13W before the polishing process is reduced merely by such a degree below 0.5 μm, even when executing an ensuing polishing, process, there is no residual wiring material film 16 in the "fine pattern" area. Further, the wiring material film 16 buried in the broad-width slit 13W is properly polished without generating a recessed portion therein. In other words, it is suggested that, in order to level off the differential step St, polishing process shall be executed until the local differential step St is reduced to 5 μm or less.

While executing the inventive method of manufacturing a semiconductor device according to the first preferred embodiment of the present invention, the above-referred local differential step S generated on the surface of the wiring material film 16 is reduced by way of preserving the wiring material film 16 on the insulating film 12, and then the surface of the wiring material film 16 is substantially leveled off. Next, by way of executing an electrolytic polishing process, the wiring material film 16 right above the insulating film 12 is removed by way of preserving the wiring material film 16 solely inside of the recessed portions 13, and thus, the slits 13 are individually filled with the wiring material film 16 buried therein. Accordingly, it is possible to remove such wiring material film 16 deposited on unnecessary portions while still preserving such wiring material film 16 deposited on essential portions, thus making it possible to introduce such an electrolytic polishing process to provide a wiring structure inside of the slits 13. Further, inasmuch as the electrolytic polishing process dispenses expensive slurry normally used for the chemical-mechanical polishing process, it is possible to form a metallic-wiring structure at a low running cost. Further, there is such an advantage in that erosion normally occurring in the chemical-mechanical polishing process can be prevented.

Next, the second preferred embodiment for executing the method of manufacturing a semiconductor device according to the present invention is described below. Such second preferred embodiment according to the present invention executes a chemical polishing process for canceling the local differential step S of the wiring material film 16 generated by effect of the electrolytic plating process. Except for the chemical polishing process, all the processes executed via the second preferred embodiment of the present invention are exactly identical to those which are described above in relation to the preceding first preferred embodiment of the present invention.

A chemical polishing process may be executed by way of merely dipping the polishing object in a chemical polishing solution. In place of this method, it is also possible to level off the wiring material film 16 by way of hardening it via a method comprising such a step to thin off a thickness of diffused layers by causing chemical solution to flow over the plated surface at a fast flow rate to enable a projected portion to be etched off faster.

Even when executing the above-referred chemical polishing process, in order to more effectively execute an electrolytic polishing process in the ensuing step, it is so arranged that copper film generated via an electrolytic polishing process can remain on the field portion 12F without being removed thoroughly.

Figure 3A:
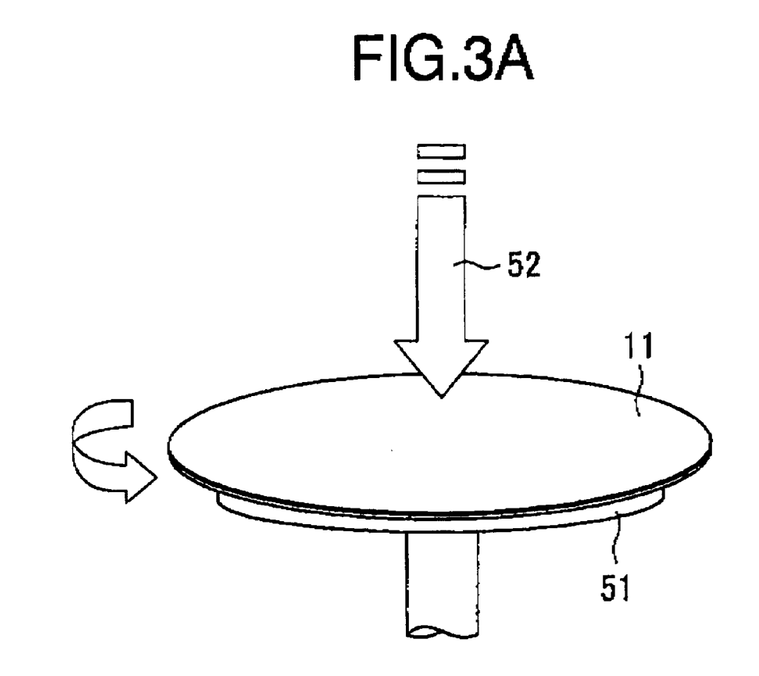
FIG. 3 presents a schematic diagram exemplifying an inventive method for shifting chemical-polishing solution at a high flow rate, according to a preferred embodiment of the present invention.
Figure 3B:
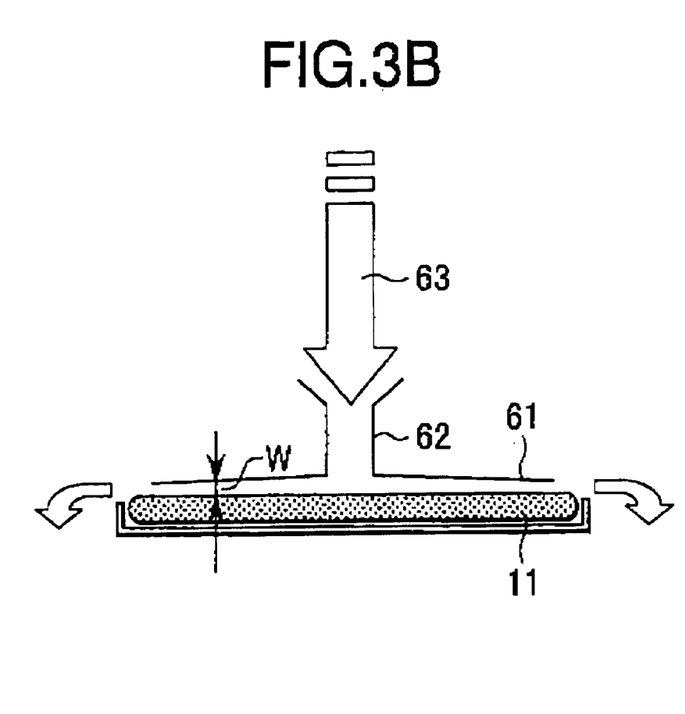

Further, as shown in FIG. 3A, in order to enable the chemical polishing solution to flow over the surface of the wiring-material film 16 at a faster flow rate, for example, there is such a method of dripping a chemical polishing solution 52 onto a substrate (wafer) 11 while rotating a spin-chuck 51 in the arrow direction at a fast rotating speed as of the state in which the substrate (wafer) 11 is retained on the spin-chuck 51 which is capable of rotating at a fast speed in the arrow direction. Alternatively, as shown in FIG. 3B, for example, such a flat plate 61 capable of securing a maximum of 3 mm of space is disposed on the substrate (wafer) 11 by way of providing a supply device 62 for the flat plate 61 above the center portion of the substrate (wafer) 11. By way of supplying pressurized chemical polishing solution 63 into a space W between the flat plate 61 and the substrate (wafer) 11 from the supply device 62, it is possible to accelerate a flow rate of the chemical polishing solution 52 flowing over the surface of the substrate (wafer) 11.

Next, an example of chemical polishing solution suitable for composing the above-referred polishing solution is described below. Such chemical polishing solution composed of phosphoric acid is cited as one suitable chemical polishing solution. Such phosphoric-acid chemical polishing solution comprises a mixture of 550 ml/liter of phosphoric acid, 100 ml/liter of nitric acid, 50 ml/liter of glacial acetic acid, and 2 ml/liter of hydrochloric acid. A temperature of the above chemical polishing solution and a duration of a polishing process using this polishing solution are defined in a range from 55° C. to a maximum of 88° C. for 1 to 3 minutes. Further, there is a chemical polishing solution comprising nitric acid called "kirinsu" solution, comprising a mixture of 200 ml/liter of nitric acid, 400 ml/liter of sulfuric acid, 2 ml/liter of hydrochloric acid, and 300 ml/liter of water. A temperature of this chemical polishing solution and duration of the polishing process using this chemical solution are defined in a range from 20° C. to a maximum of 80° C. for 30 seconds to 2 minutes. Generally, this chemical polishing solution is characterized by having a fast etching rate.

Next, a third preferred embodiment for the method of manufacturing a semiconductor device according to the present invention is described below In place of the above-referred first preferred embodiment which cancels the differential step S locally generated in the wiring material film 16 via an electrolytic plating process, the third preferred embodiment cancels the local differential step S by applying a mechanical polishing process. When executing a mechanical polishing process, such grinding particles ranging from #10000 to a maximum of #20000 of grading distribution comprising, for example, cerium oxide, diamond, alumina, or silica, may be utilized. Applicable polishing solution comprises pure water, aqueous solution of hydrogen peroxide, ethanol, or isopropyl alcohol. Except for the above polishing processes, all the processes executed by the third preferred embodiment of the present invention are identical to those which were described earlier in relation to the first preferred embodiment of the present invention.

By way of leveling off the plated substrate 11 via buffing while dripping polishing solution, it is also possible to secure the same effect as in the case of executing the above mechanical polishing process.

Referring now to the cross-sectional view shown in FIG. 4, the first form for implementing the second preferred manufacturing method according to the present invention is described below.

Figure 4A:
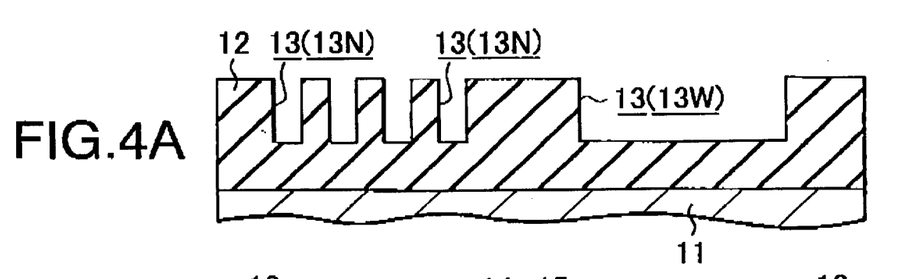
FIG. 4 presents a cross sectional view designating another practical form for implementing a method of manufacturing a semiconductor device according to a preferred embodiment of the present invention.

As shown in FIG. 4A, initially, a predetermined element (not shown) is formed on a semiconductor substrate 11, for example. Next, an insulating film 12 is formed on the semiconductor substrate 11. Next, a resist pattern is formed via a lithographic technique by way of providing an aperture for the resist pattern at a predetermined position. Next, using the resist pattern as a masking for executing an etching process, a plurality of recessed portions 13 for burying wiring material film 16 are formed through the insulating film 12 by 0.5 μm of depth for example. The slit 13 comprises such plural slits 13N each being formed with a so-called "fine pattern" and a single broad-width slit 12W having 0.5 μm to 5.0 μm of width, for example. In this structure, a plurality of slits 13N each having a narrow width of 0.15 μm to 0.5 μm of are individually disposed across intervals of 0.15 μm to 0.50 μm.

Figure 4B:
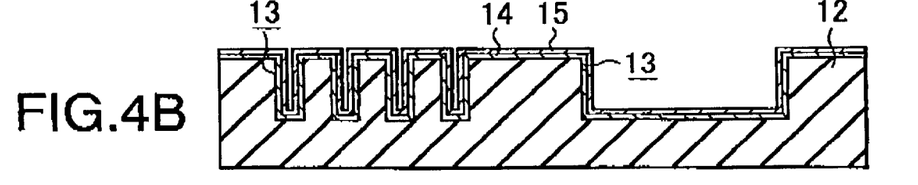

Next, as shown in FIG. 4B, by applying a chemical vapor deposition (CVD) process, for example, a barrier layer 14 comprising tungsten nitride for example, is formed on the inner surface of the recessed portions 13 and also on the insulating film 12. As an example of the condition for forming the tungsten nitride film, such gas comprising a mixture of tungsten hexa-fluoride ($WF_6$), nitrogen ($N_2$), and hydrogen ($H_2$) was utilized at a flow rate of 0.25 ml/min and film-forming temperature of 300° C. to 400° C.

Next, by applying a physical vapor deposition (PVD) method such as a sputtering process, for example, an electrolytic plate seed layer 15 is formed with copper film. As an example of the condition for forming the copper film, the applied condition includes the following; 12KW of DC power for driving a sputtering device; argon (Ar) gas for processing the copper film at a flow rate of 50 cm$^3$/min, at a film-forming atmospheric pressure of 0.2 Pa and a forming temperature of 100° C.

Figure 4C:
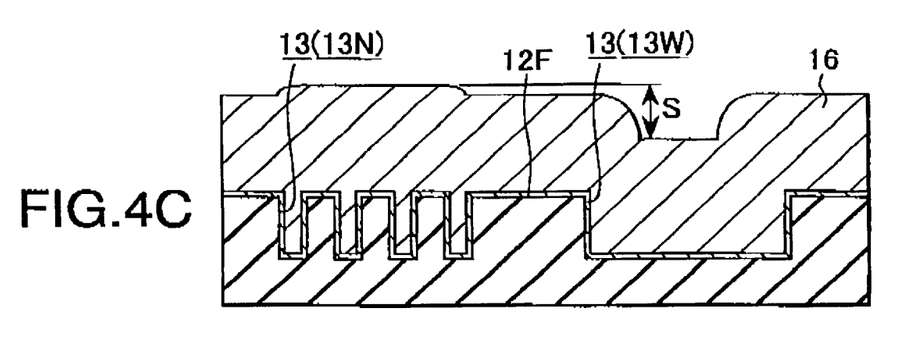
Figure 4D:
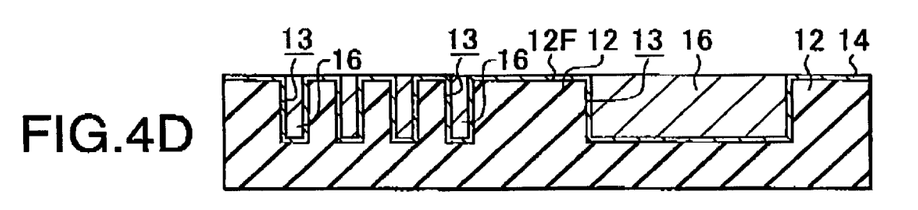
Figure 4E:
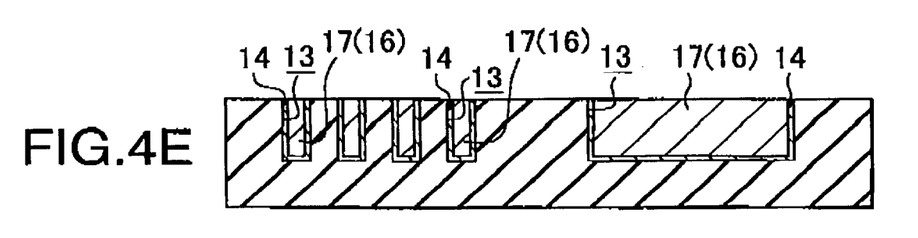

An illustration of the semiconductor substrate 11 is omitted from FIG. 4C to FIG. 4E.

Figure 2B:
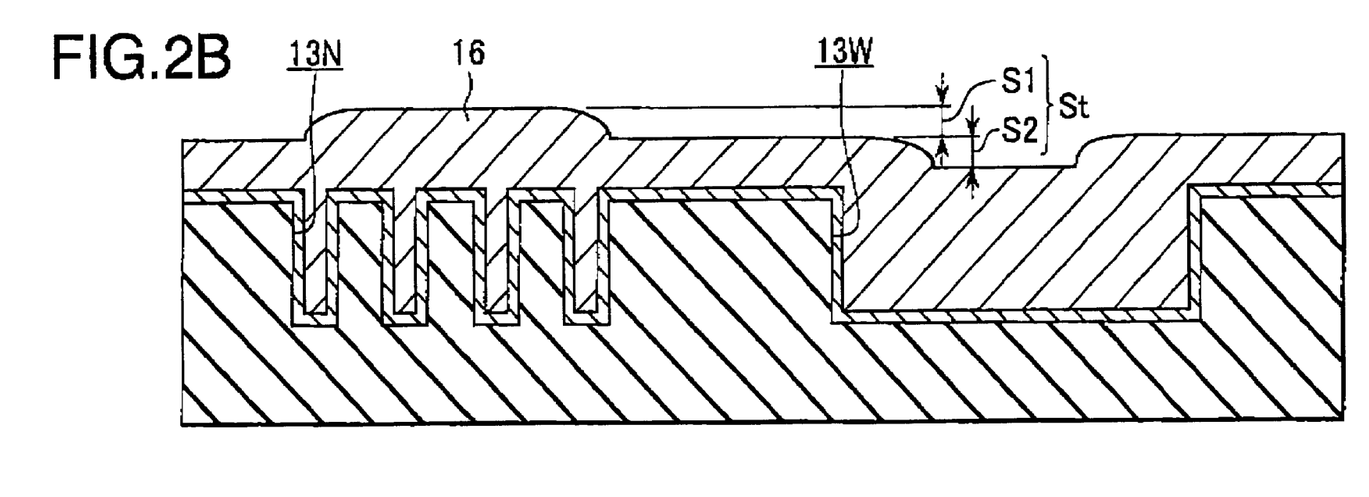

Next, as shown in FIG. 4C, after depositing copper particles by, for example, 1.5 μm of thickness, in order to bury all the slits 13, such a wiring-material film 16 is formed, which also includes the seed layer 15 shown in FIG. 2B. In this case, it is essential that the wiring material film 16 shall be formed in a specific domain of the slits 13 by such a thickness more than double the depth of the slits 13. Due to differential width at apertures of the slits 13, thickness of the wiring material film 16 is quite thick in such a domain where the slits 13 are respectively formed with so-called "fine pattern" On the other hand, a film thickness of the broad-width slit 13W is thinner than that of the surface of the wiring-material film 16 deposited in the field portion 12F. In this way, differential step S is locally generated in the deposited wiring-material film 16. However, inasmuch as the wiring material film 16 is formed with its own thickness more than double the depth of the slits 13, the local differential step S remains at a maximum of 0.5 μm or less.

As an example of the condition for executing the above electrolytic plating process, such electrolytic solution comprising copper sulfide is used by applying an electric current of 2.83A at 18° C. for 6 hours and 40 minutes before completing deposition of a copper film of 1.5 μm.

Next, as shown in FIG. 4D, initially, the wiring-material film 16 is polished via an electrolytic polishing process, and then, the wiring-material film 16 deposited on the field portion 12F of the insulating film 12 is removed while preserving such wiring-material film 16 solely inside of the slits 13. While executing the above electrolytic polishing process, if the wiring-material film 16 is totally removed from the field portion 12F of the insulating film 12, inasmuch as current flows through the barrier layer 14 containing such electric conductivity lower than that of copper, in the case in which the wiring-material film 16 still remains on the field portion 12F, an electric conductivity of the wiring-material film 16 grows higher than that of the peripheral portions, thus facilitating execution of the electrolytic polishing process. Accordingly, the wiring-material film 16 on the field portion 12F is thoroughly and uniformly removed.

As an example of the above electrolytic polishing condition, using such polishing solution composed of phosphoric acid having a specific gravity of 1.6, the electrolytic polishing process is executed by applying a current density of 5A/dm$^2$ to 20A/dm$^2$ at 15° C. to 25° C. for 2 to 3 minutes.

While executing the electrolytic polishing process, an electrode (not shown in the figures) is brought into contact with the polishing object to cause the wiring-material film 16 to remain on the abutted portion, and thus, the remaining wiring-material film 16 is removed via a wet etching process by applying mixed aqueous solution comprising fluoric acid and hydrogen peroxide.

Next, as shown in FIG. 4E, by way of executing such a spin-rinsing process utilizing aqueous solution of hydrogen peroxide for example, the barrier layer 14 exposed by effect of the removal of the wiring-material film 16 is removed. In this way, a slit-wiring structure 17 comprising the wiring-material film 16 filled in the slits 13 via the barrier layer 14 is eventually formed.

As an example of the condition for removing the barrier layer 14 comprising tungsten nitride having a current density of 5A/dm$^2$, by applying aqueous solution of hydrogen peroxide, a rinsing process is executed at 15° C. to 40° C. for 1 to 3 minutes.

When forming an upper-layer structure, it is so arranged that, initially, the surface of the substrate 11 treated with those processes described above by referring to FIG. 1 is covered with silicon nitride, and then, those processes identical to those which were described earlier by referring to FIG. 1 are serially executed before eventually forming the upper-layer structure.

Further, after completing formation of the wiring-material film 16 described earlier by referring to FIG. 4C, even when such a local differential step S may be generated by approximately 0.5 μm, it is possible to properly polish the wiring-material film 16 without causing residual wiring-material film to be generated in the fine pattern domain via the polishing process, and yet, without causing recessed portion to be generated in the wiring-material film 16 buried in the broad-width slit 13W.

When executing the preferred embodiment for realizing the second inventive method described above, the wiring-material film 16 which buries the recessed portions 13 and is formed through the insulating film 12 deposited on the substrate 11 is eventually developed into such a wiring-material film 16 incorporating own thickness more than double the depth of the slits 13, whereby enabling the wiring-material film 16 to be superficially leveled off. In the next step, such a wiring-material film 16 deposited right above the insulating film 12 is removed by way of preserving such wiring-material film 16 deposited solely inside of the slits 13, whereby enabling all the slits 13 to be filled with the wiring material film 16 deposited therein. Accordingly, it is possible to properly remove such wiring-material film 16 deposited on unnecessary portions, in other words, right above the field portion 12F of the insulating film 12, while still preserving such wiring-material film 16 deposited on essential portions. This makes it possible to introduce the electrolytic polishing process for composing the wiring-material filled slit structure. Further, inasmuch as the electrolytic polishing process dispenses with expensive slurry normally being used for a chemical-mechanical polishing process, it is possible to properly form a metallic wiring structure at a low running cost. Further, there is such an advantage in that, unlike the chemical-mechanical polishing process, the electrolytic polishing process totally avoids generation of erosion.

Finally, the configurations and structures of respective units and portions described specifically with respect to the preferred embodiments of the present invention are only examples of realization of the present invention, so the embodiments thereof should not be construed as to limiting the technical scope of the present invention.

What is claimed is:

1. A method of manufacturing a semiconductor device comprising the following steps of:

forming a wiring material film over a recessed portion formed in an insulating film formed via a plating process;

reducing differential steps locally generated on a surface of said wiring material film via first polishing by performing a chemical-mechanical polishing process, a mechanical polishing process, or a chemical polishing process; and thereafter removing an additional portion of said wiring material film by performing electrolytic polishing without performing any additional wiring film removal process either before the first polishing or after the step of electrolytic polishing.

2. The method of manufacturing a semiconductor device according to claim 1, wherein said recessed portion comprises a contact hole or a slit for accommodating a metallic wiring structure, a contact hole formed through a wiring slit and a bottom portion of said wiring slit.

3. The method of manufacturing a semiconductor device according to claim 1, wherein said recessed portion comprises a slit for accommodating a metallic wiring structure, a contact hole formed through said metallic wiring structure and a bottom portion of said metallic wiring structure, wherein said wiring material film is formed having a thickness of double or more than a depth of said recessed portion accommodating a metallic wiring structure therein.

4. A method of manufacturing a semiconductor device comprising the following steps of:

forming a wiring material film for burying a recessed slit portion formed in an insulating film via a plating process, wherein said wiring material film is formed having a thickness of double or more than a depth of said recessed portion; and removing said wiring material film deposited on said insulating film by applying an electrolytic polishing process without performing an additional wiring material film removal process prior to or after performing electrolytic polishing and preserving said wiring material film deposited inside of said recessed portion.

* * * * *